(12) United States Patent
Wirbeleit et al.

(10) Patent No.: US 7,329,599 B1
(45) Date of Patent: Feb. 12, 2008

(54) METHOD FOR FABRICATING A SEMICONDUCTOR DEVICE

(75) Inventors: Frank Wirbeleit, Wappingers Falls, NY (US); Tibor Bolom, Fishkill, NY (US); Johannes Van Meer, Fishkill, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 246 days.

(21) Appl. No.: 11/082,618

(22) Filed: Mar. 16, 2005

(51) Int. Cl.
*H01L 21/4763* (2006.01)

(52) U.S. Cl. ............... 438/627; 438/297; 257/E21.199
(58) Field of Classification Search ............... 438/627; 257/E21.199
See application file for complete search history.

(56) References Cited

U.S. PATENT DOCUMENTS

| | | | |
|---|---|---|---|
| 4,884,123 A | 11/1989 | Dixit et al. | |
| 5,571,753 A * | 11/1996 | Saruwatari | 438/527 |
| 5,912,188 A * | 6/1999 | Gardner et al. | 438/740 |
| 5,985,756 A * | 11/1999 | Shinmura | 438/648 |
| 6,027,990 A * | 2/2000 | Thakur et al. | 438/533 |
| 6,080,667 A * | 6/2000 | Urabe | 438/659 |
| 6,197,684 B1 * | 3/2001 | Wang | 438/643 |
| 6,288,430 B1 * | 9/2001 | Oda | 257/382 |
| 6,410,383 B1 * | 6/2002 | Ma | 438/247 |
| 6,511,905 B1 * | 1/2003 | Lee et al. | 438/629 |
| 6,703,307 B2 * | 3/2004 | Lopatin et al. | 438/653 |
| 7,115,498 B1 * | 10/2006 | Adem | 438/627 |
| 2002/0019127 A1 * | 2/2002 | Givens | 438/637 |
| 2002/0115292 A1 * | 8/2002 | Andricacos et al. | 438/687 |
| 2003/0118798 A1 * | 6/2003 | Fujii | 428/209 |
| 2005/0280115 A1 * | 12/2005 | Wise et al. | 257/506 |
| 2005/0280118 A1 * | 12/2005 | Lin et al. | 257/618 |

FOREIGN PATENT DOCUMENTS

| | | | |
|---|---|---|---|
| JP | 02026052 A | * | 1/1990 |
| JP | 08264651 A | * | 10/1996 |
| JP | 2000164717 A | * | 6/2000 |

* cited by examiner

*Primary Examiner*—B. William Baumeister
*Assistant Examiner*—Igwe U. Anya
(74) *Attorney, Agent, or Firm*—Ingrassia Fisher & Lorenz, P.C.

(57) ABSTRACT

Methods are provided for semiconductor devices having low contact resistance. The method in accordance with one embodiment of the invention comprises forming an insulating layer overlying a semiconductor substrate, the semiconductor substrate having a device region therein. An opening is formed through the insulating layer to expose a portion of the device region, and the portion of the device region is then electrically contacted by a metallic liner layer. To reduce the resistance of the liner layer and hence the contact, ions of a conductivity determining impurity are implanted into the metallic liner layer. A metal layer is then deposited overlying the metallic liner layer to fill the opening through the insulating layer and to form a conductive plug.

18 Claims, 5 Drawing Sheets

METHOD FOR FABRICATING A SEMICONDUCTOR DEVICE

TECHNICAL FIELD

The present invention generally relates to methods for fabricating semiconductor devices, and more particularly relates to methods for fabricating semiconductor devices having low contact resistance.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain electrodes between which a current can flow. A control voltage applied to the gate electrode controls the flow of current through a channel between the source and drain electrodes. As the complexity of the integrated circuits increases, more and more MOS transistors are needed to implement the integrated circuit function. As more and more transistors are designed into the IC, it becomes important to shrink the size of individual MOS transistors so that the size of the IC remains reasonable and the IC can be reliably manufactured. Shrinking the size of an MOS transistor implies that the minimum feature size, that is, the minimum width of a line or the minimum spacing between lines, is reduced. MOS transistors have now been aggressively reduced to the point at which the gate electrode of the transistor is less than or equal to 20 nanometers (nm) in width. One feature that must be reduced as the transistor size shrinks is the contact opening. A contact opening is the opening through one or more insulating layers that is subsequently filled with a conductive material that forms a contact to a device region and allows interconnections between devices of the IC. The conductive material forming the contact, which often takes the form of a plug, may be tungsten or other metals. A conductive liner is often used to physically isolate the tungsten or other metal from the insulating material surrounding the contact and from the underlying device region. As the size of the contact opening is reduced, the resistance of the contact increases. The increase in resistance can result from an increase in the resistance of the liner material as well as an increase in resistance of the interface between the liner and the plug material. Increases in contact resistance can seriously affect the performance of the IC because any increase in contact resistance increases the resistance-capacitance (RC) time constant of the device.

Accordingly, it is desirable to provide a method of fabricating a semiconductor device that allows small feature size without adversely affecting contact resistance. In addition, it is desirable to provide a method of fabricating a semiconductor device that produces low resistance device contacts. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating semiconductor devices having low contact resistance. The method in accordance with one embodiment of the invention comprises forming an insulating layer overlying a semiconductor substrate, the semiconductor substrate having a device region therein. An opening is formed through the insulating layer to expose a portion of the device region, and the portion of the device region is then electrically contacted by a metallic liner layer. To reduce the resistance of the liner layer and hence the contact, ions of a conductivity determining impurity are implanted into the metallic liner layer and liner-semiconductor interface. A metal layer is then deposited overlying the metallic liner layer to fill the opening through the insulating layer and to form a conductive plug.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
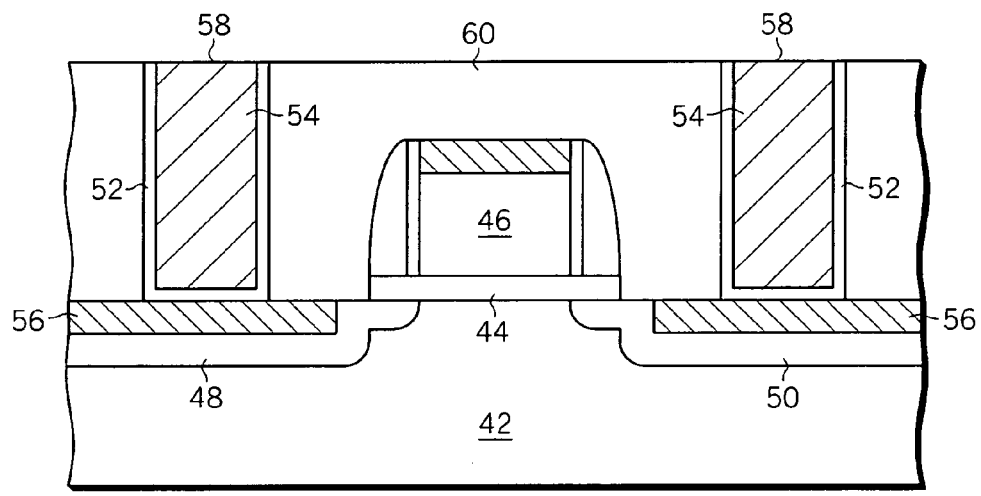
FIG. 1 illustrates schematically, in cross section, a semiconductor device in accordance with the invention.

FIG. 1 illustrates schematically, in cross section, an MOS transistor 40 in accordance with an embodiment of the invention. MOS transistor 40 includes a silicon substrate 42, or a layer of silicon on an insulating substrate, with a gate insulator 44 formed on the substrate surface. A gate electrode 46 is formed on the gate insulator. A source region 48 and a drain region 50 are formed in the silicon substrate by introducing appropriate impurity determining dopants such as arsenic or phosphorus for an N-channel MOS transistor or boron for a P-channel MOS transistor. Contact to the source and drain regions is made through a metal silicide layer 56 and by metal plugs 58. Metal plugs 58 are formed through openings in insulator layer 60. Insulator layer 60 provides electrical isolation between transistor 40 and overlying layers of interconnecting metal. As will be explained in more detail below, metal plugs 58 include a thin layer of liner material 52 and a thicker layer of filler metal 54. In accordance with an embodiment of the invention, liner material 52 is treated by ion implantation to improve the resistance characteristics of metal plug 58. This ion implantation places dopant impurities in the liner material, at the interface between the plug and the liner, and at the interface between the liner and the metal silicide.

FIGS. 2-11 illustrate method steps for manufacturing a semiconductor device such an MOS transistor 140, similar to MOS transistor 40, in accordance with one embodiment of the invention. In this illustrative embodiment MOS transistor 140 is an N-channel MOS transistor, although similar method steps can be used to manufacture a P-channel MOS transistor with appropriate changes in impurity determining dopant types. Likewise, similar method steps can used to manufacture complementary MOS (CMOS) transistors. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. MOS transistor 40 can be one of many transistors that are used to implement a complete semiconductor device such as a CMOS integrated circuit. Although illustrated with reference to MOS transistors, the invention is not limited to use in the fabrication of MOS integrated circuits, but instead is applicable to the fabrication of all types of semiconductor devices.

Figure 2:
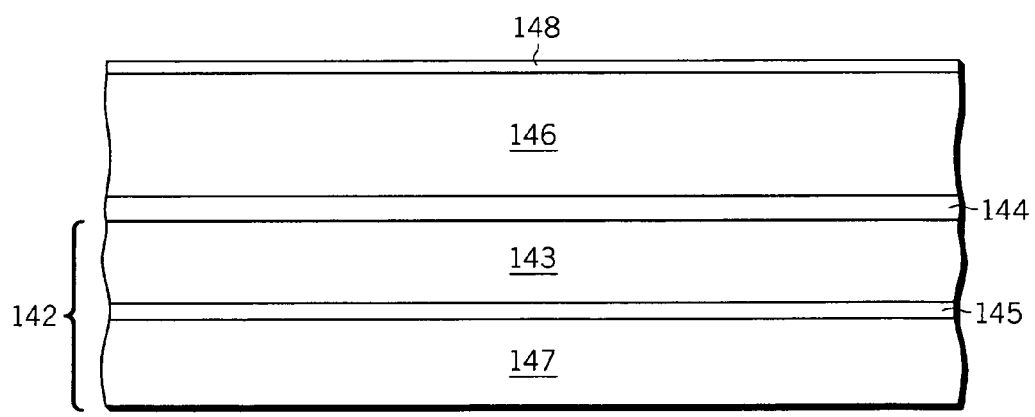
FIGS. 2-11 illustrate schematically, in cross section, method steps in accordance with various embodiments of the invention for fabricating a semiconductor device, and of those, FIGS. 9-11 specifically illustrate method steps in the formation of a contact for such a semiconductor device.

As illustrated in FIG. 2, the manufacture of MOS transistor 140 in accordance with an embodiment of the invention begins with providing a semiconductor substrate 142. The semiconductor substrate is preferably a silicon substrate wherein the term "silicon substrate" is used herein to encompass the relatively pure silicon materials typically used in the semiconductor industry as well as silicon admixed with other elements such as germanium and the like. The term "semiconductor substrate" is also used to encompass the substrate itself together with metal or insulator layers that may overly the substrate. Silicon substrate 142 may be a bulk silicon wafer or a thin layer of silicon 143 on an insulating layer 145 (commonly know as a silicon-on-insulator wafer or SOI wafer) that, in turn, is supported by a silicon carrier wafer 147. A layer of gate insulator 144 is formed on the surface of silicon substrate 142. The gate insulator may be a thermally grown silicon dioxide formed by heating the silicon substrate in an oxidizing ambient, or may be a deposited insulator such as a silicon oxide, silicon nitride, silicon oxynitride, a high dielectric constant insulator such as HfSiO, or the like. Deposited insulators can be deposited by chemical vapor deposition (CVD), low pressure chemical vapor deposition (LPCVD), plasma enhanced chemical vapor deposition (PECVD), or atomic layer deposition (ALD). The gate insulator material is typically 1-10 nanometers (nm) in thickness. In accordance with one embodiment of the invention a layer preferably of polycrystalline silicon 146, or in the alternative metal or other conductive material, is deposited onto the layer of gate insulator. The layer of polycrystalline silicon can be deposited as an impurity doped layer, but is preferably deposited as undoped polycrystalline silicon and is subsequently impurity doped by ion implantation. A layer 148 of hard mask material such as silicon oxide, silicon nitride, or silicon oxynitride can be deposited onto the surface of the polycrystalline silicon to aid in subsequently patterning the polycrystalline silicon. The polycrystalline material can be deposited to a thickness of about 100 nm by LPCVD by the hydrogen reduction of silane (SiH$_4$). The hard mask material can be deposited to a thickness of about 50 nm, also by LPCVD.

Figure 3:
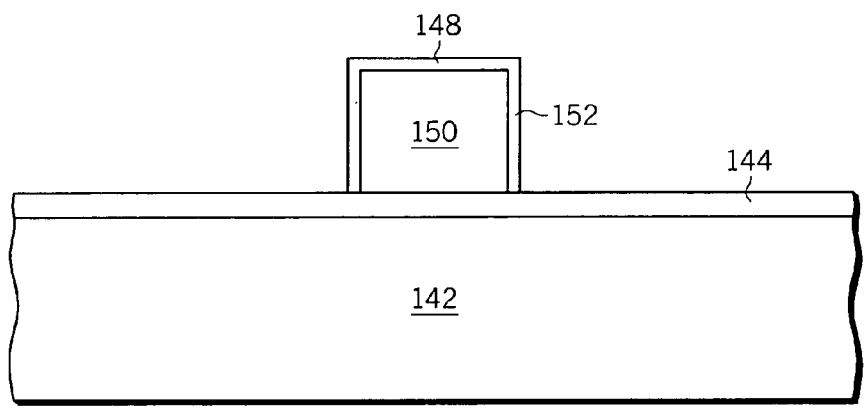

Hard mask layer 148 and underlying layer of polycrystalline silicon 146 are photolithographically patterned to form gate electrode 150 as illustrated in FIG. 3. Preferably gate electrode 150 has a width equal to the minimum line width allowable by the design rules being used to design the integrated circuit of which MOS transistor 140 is a part. The polycrystalline silicon can be etched in the desired pattern by, for example, plasma etching in a Cl or HBr/O$_2$ chemistry and the hard mask can be etched, for example, by plasma etching in a CHF$_3$, CF$_4$, or SF$_6$ chemistry. Following the patterning of the gate electrode, a thin layer 152 of silicon oxide is thermally grown on the sidewalls of the gate electrode by heating the polycrystalline silicon in an oxidizing ambient. Layer 152 can be grown to a thickness of about 2-5 nm.

Figure 4:
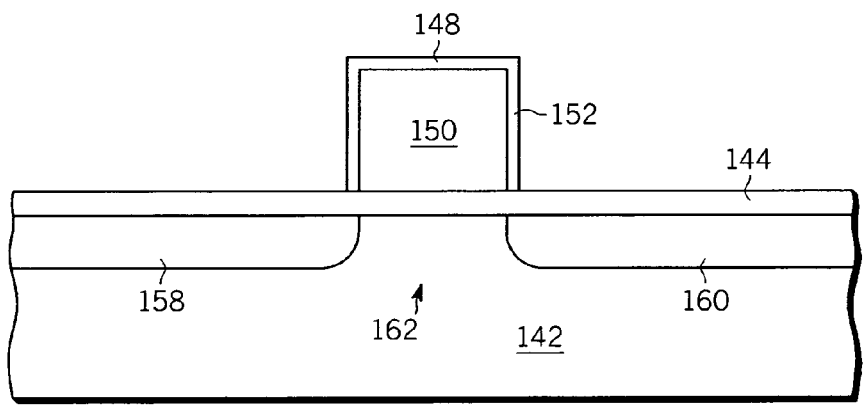

Gate electrode 150 can be used as an ion implantation mask to form source 158 and drain 160 regions in silicon substrate 142 as illustrated in FIG. 4. By using the gate electrode as an ion implant mask, the source and drain regions and channel 162, defined as the substrate region between source 158 and drain 160, are all self aligned with the gate electrode. For an N-channel MOS transistor the source and drain regions are preferably formed by implanting arsenic ions, although phosphorus ions could also be used. Source region 158 and drain region 160 are shallow and preferably have a junction depth of less than about 20 nm and most preferably less than about 5-10 nm and are heavily impurity doped to about 10 ohms per square.

Figure 5:
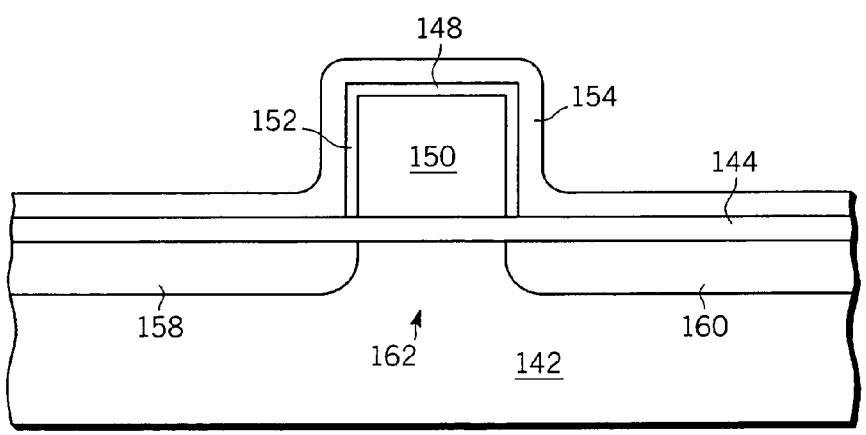

As illustrated in FIG. 5, a layer 154 of spacer forming material such as silicon oxide or silicon nitride is deposited over oxide layer 152, the portion of hard mask layer 148 remaining on the top of the gate electrode, and the remainder of gate insulator 144. The layer of spacer forming material can be deposited, for example, to a thickness of about 15 nm by LPCVD. Layer 152 serves to protect the thin gate insulator that would otherwise be exposed at the edge of gate electrode 150. Layer 152 also provides a barrier separating the polycrystalline silicon of gate electrode 150 from the overlying layer of sidewall spacer material.

Figure 6:
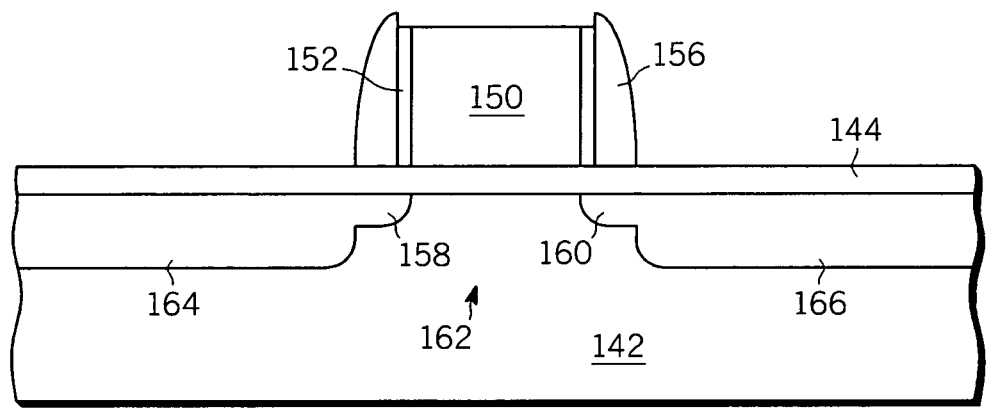

Layer 154 of spacer forming material is anisotropically etched, for example by reactive ion etching (RIE) using a CHF$_3$, CF$_4$, or SF$_6$ chemistry, to form sidewall spacers 156 on each edge of gate electrode 150 as illustrated in FIG. 6.

Gate electrode 150 and sidewall spacers 156 can be used as an ion implantation mask to form a deeper source region 164 and a deeper drain region 166 in silicon substrate 142 as also illustrated in FIG. 6. Regions 164 and 166 will thus be self aligned with spacers 156 and the gate electrode. For an NMOS transistor, regions 164 and 166 can be formed by ion implanting ions of arsenic or phosphorus. The deeper source and drain regions help to insure that later formed silicide regions will not extend through the doped source and drain regions causing an electrical short to substrate 142. Although some integrated circuits fabrication processes may use additional spacers and additional implants into the source, drain, channel, or other regions, such additional process steps are not necessary to illustrate the invention and hence need not by shown.

Figure 7:
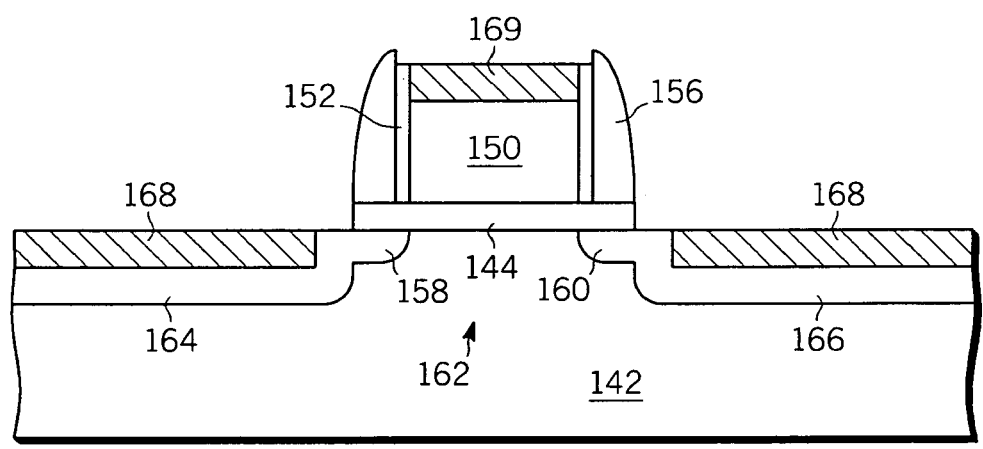

Following the implantation of regions 164 and 166, the remainder of gate insulator layer 144 that is not covered by gate electrode 150 or sidewall spacers 156 is removed to expose the surface of the source and drain regions. A layer of silicide forming metal is deposited onto the surface of the source and drain regions and is heated, for example by rapid thermal annealing (RTA), to form a metal silicide layer 168 at the top of each of the source and drain regions as well as a metal silicide layer 169 on gate electrode 150 as illustrated in FIG. 7. The silicide forming metal can be, for example, cobalt, nickel, rhenium, ruthenium, or palladium, and preferably is either cobalt or nickel or nickel plus about 5% platinum. The silicide forming metal can be deposited, for example, by sputtering to a thickness of about 5-50 nm and preferably to a thickness of about 10 nm. Any silicide forming metal that is not in contact with exposed silicon, for example the silicide forming metal that is deposited on the sidewall spacers, does not react during the RTA to form a silicide and may subsequently be removed by wet etching in a $H_2O_2/H_2SO_4$ or $HNO_3/HCl$ solution. The sidewall spacers restrict the formation of silicide layer 168 so that the metal silicide formed on the source and drain regions does not contact gate electrode 150 which would cause an electrical short between the gate electrode and the source and/or drain region.

Figure 8:
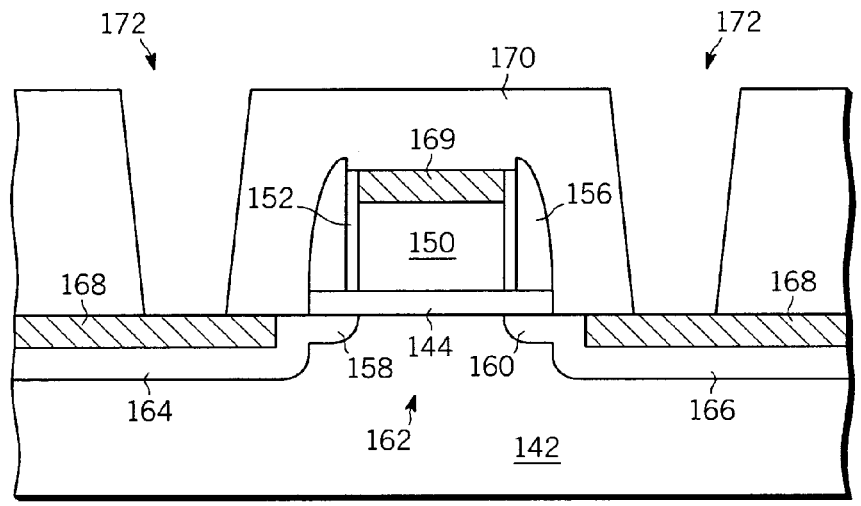

As illustrated in FIG. 8, a layer of dielectric insulating material 170 is deposited and subsequently photolithographically patterned and etched to form contact openings 172 extending through the insulating material and exposing a portion of silicide layers 168 on the source and drain regions. The insulating layer may be planarized by a chemical mechanical planarization (CMP) process before patterning. Metal plugs must be formed in contact openings 172 so that the source and drain regions can be appropriately connected electrically to other devices in the integrated circuit to implement the desired circuit function. Metal plugs are typically formed of tungsten, although other metals can also be used. It is important to use a liner along the sidewalls and at the bottom of the contact opening to prevent undesired reaction of the metal, especially if the metal is tungsten, both during metal deposition and during subsequent heat treatments, with the underlying silicon substrate, the underlying metal silicide, and in some applications with the dielectric insulating material. The liner material also facilitates good, low resistance contact to the underlying device regions. The liner material can be, for example, a layer of titanium followed by a layer of titanium nitride. It has been observed, however, that using such a liner structure in small contact openings can lead to undesirably high contact resistance. The high contact resistance is believed to result from the high sheet resistivity of the thin titanium nitride layer and the high interface resistance at the interface between the titanium nitride and the tungsten plug material.

Figure 9:
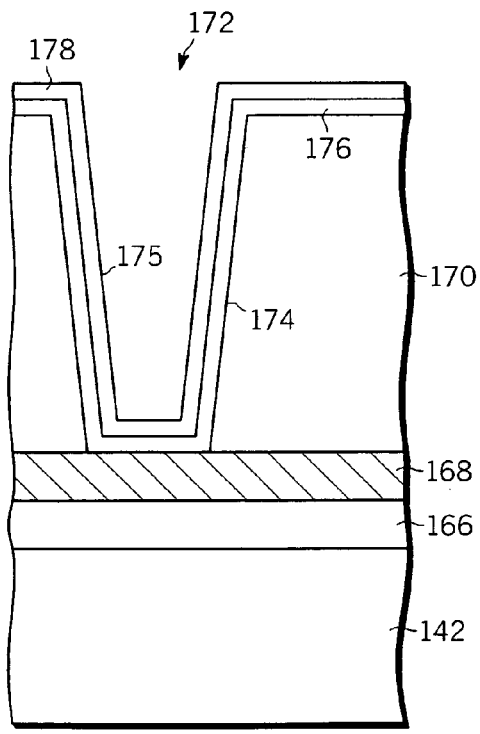
Figure 10:
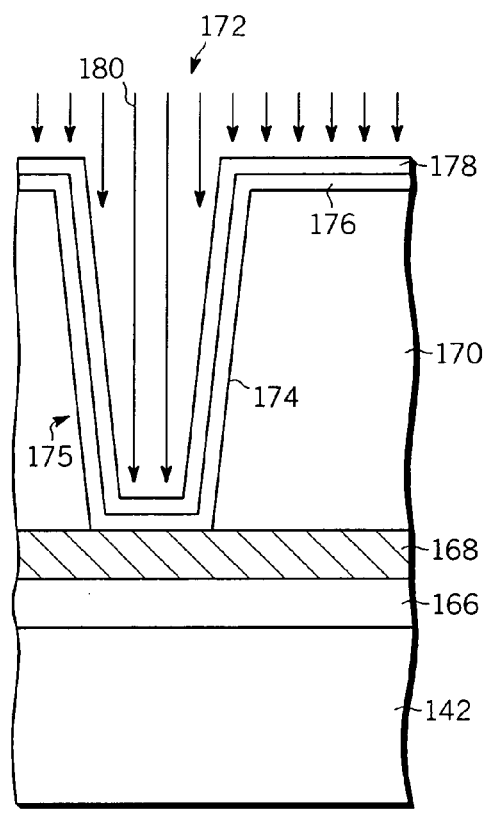
Figure 11:
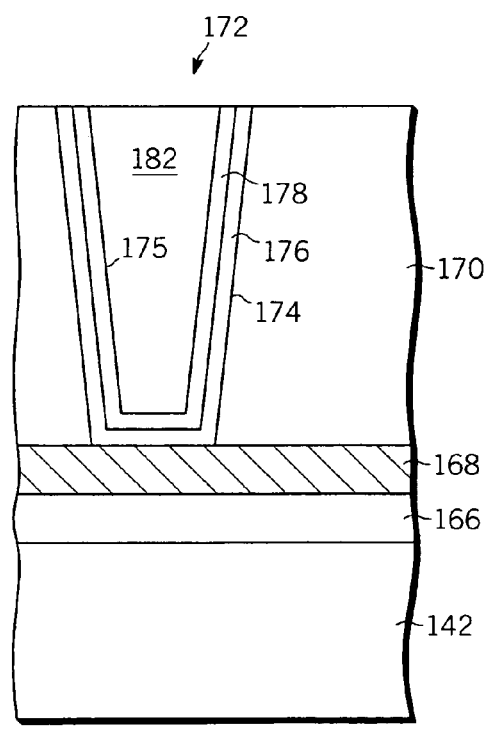

FIGS. 9-11 illustrate, in cross section, one contact opening 172 through dielectric insulating layer 170. The contact opening, having sidewall 174, exposes a portion of metal silicide layer 168 at the upper surface of an impurity doped region such as drain region 166. In accordance with an embodiment of the invention, a metallic liner layer 175 is formed on sidewall 174 and on the exposed portion of metal silicide 168. The metallic liner layer is in electrical contact with impurity doped region 166. The metallic liner layer preferably includes a layer 176 of titanium and a layer 178 of titanium nitride or alternatively a layer of tantalum and a layer tantalum nitride. The layer of titanium preferably has a thickness of about 10 nm and is deposited by sputtering, PECVD, or atomic layer deposition (ALD). Because of the nature of the deposition process, the titanium layer will be slightly thinner along the sidewalls than at the bottom of contact opening 172. The layer of titanium promotes good adhesion to the insulator along sidewall 174 and good electrical contact to metal silicide 168. A layer 178 of titanium nitride is formed overlying titanium layer 176. Preferably the layer of titanium nitride has a thickness of about 10 nm, again slightly thinner along the sidewall as compared to the bottom of the contact opening. Titanium nitride layer 178 can be formed by PECVD, sputtering, ALD, or by nitridation of titanium layer 176. If formed by nitridation of the titanium layer, layer 176 must be deposited to a thickness of about 20 nm so that the final structure preferably results in a layer of titanium nitride over a layer of titanium with both layers having a thickness of about 10 nm. Preferably titanium nitride layer 178 is deposited by PECVD from the reaction of $TiCl_4$ and nitrogen at a temperature of about 400° C. in a three step process in which the final preferred thickness of titanium nitride is deposited in three separate deposition steps. In each of the separate deposition steps approximately one third of the total thickness is deposited. The three step deposition results in a more uniform layer of titanium nitride than is obtained with a single step deposition. Layer 178 of titanium nitride acts as a diffusion barrier to stop the diffusion of a subsequently deposited layer of tungsten or other plug material. The titanium nitride layer also stops the diffusion into the metal silicide or underlying semiconductor material of tungsten hexafluoride ($WF_6$) used in the deposition of the tungsten.

In accordance with an embodiment of the invention, following the formation of metallic liner layer 175, the metallic liner layer is ion implanted with low energy ions of a conductivity determining element as illustrated by arrows 180 in FIG. 10. Preferably the metallic liner layer is implanted with ions of a conductivity determining element from group 15 of the periodic table (As, P, Sb, or Bi) or with boron ions, and most preferably with ions of arsenic or phosphorus. In a preferred embodiment the ions of a conductivity determining element are implanted at an energy such that the range of the ion implantation places the implant peak at or near the interface between the titanium layer 176 and titanium nitride layer 178. For example, arsenic ions can be implanted at an energy of about 5 KeV and at an implant dose of about $5 \times 10^{15}$ per square centimeter.

As illustrated in FIG. 11, the contact is completed by depositing a plug layer 182 of tungsten or other metal overlying metallic liner 175 to fill contact opening 172. Layer 182 is preferably a layer of tungsten deposited by CVD from the reaction of $WF_6$ and hydrogen. If layer 182 is a layer of tungsten, that tungsten may include, for example, small amounts of other elements such as cobalt or silicon. It is well known, for example, to initiate the deposition of a CVD tungsten layer by first reacting $WF_6$ and silane ($SiH_4$) for a brief time before switching the deposition chemistry to $WF_6$ and $H_2$. Other metals, either deposited by CVD, physical vapor deposition, or electroless or electrolytic deposition from solution may also be used to form the plug layer. Excess amounts of the plug layer material that may deposit on the upper surface 184 of dielectric insulator layer 170, as well as the metallic liner materials deposited on that surface, can be removed by CMP. The structure following the CMP step will exhibit a planar upper surface of dielectric insulator 170 with a plug 186 having an upper surface flush with the upper surface of insulator 170.

Large scale integrated circuits typically include several levels of interconnect metallization. To implement a desired circuit function, appropriate contact must be made between selected device regions on one of those interconnect metallization levels and other selected device regions on other interconnect metallization levels. Although the invention has been described and illustrated with specific examples in which contact has been made by a plug extending through a dielectric layer to contact an impurity doped region in a semiconductor substrate, the invention is equally applicable to forming contacts between other level of interconnect metallization. The contacts between those other levels of interconnect metallization may involve other metallic liner materials and other plug metals than those described in the illustrative examples above. For example, in the upper levels of metallization on a multi-level IC, the plug metal may be copper or other conductor metals and the metallic liner may include tantalum and tantalum nitride or other metals and their nitrides. Implantation of ions of conductivity determining elements into the metallic liners of such contacts before the deposition of the plug material may reduce the resistance of those contacts just as it reduces the resistance of contacts to the device regions formed in the semiconductor substrate.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor device comprising the steps of:
    forming an insulating layer overlying a semiconductor substrate, the semiconductor substrate having a device region therein;
    forming an opening through the insulating layer to expose a portion of the device region;
    contacting the portion of the device region with a first metal layer;
    forming an electrically conductive barrier layer overlying the first metal layer, and thereby forming an interface between the first metal layer and the electrically conductive barrier layer, the first metal layer and the electrically conductive barrier layer cooperating to form a metallic liner;
    implanting ions of a conductivity determining impurity into the conductive barrier layer, the ions being implanted under implantation conditions that produce a peak implant concentration within the metallic liner substantially at the interface between the first metal layer and the electrically conductive barrier layer; and
    depositing a metal layer overlying the metallic liner and filling the opening through the insulating layer.

2. The method of claim 1 wherein the step of contacting the portion of the device region with the first metal layer comprises depositing a layer of titanium in electrical contact with the portion of the device region.

3. The method of claim 2 wherein the step of forming a layer of electrically conductive barrier layer material comprises the step of forming a layer of titanium nitride.

4. The method of claim 3 wherein the step of depositing a layer of titanium is performed by a process of physical vapor deposition, and the step of forming a layer of titanium nitride is performed by a process selected from the group consisting of physical vapor deposition, chemical vapor deposition and atomic layer deposition.

5. The method of claim 4 wherein the step of forming a layer of titanium nitride comprises the step of chemical vapor depositing a layer of titanium nitride in a multi-step deposition process.

6. The method of claim 1 wherein the device region comprises an impurity doped region having a surface and wherein the method further comprising the step of forming a layer of metal silicide at the surface of the impurity doped region and wherein the metallic barrier layer electrically contacts the metal silicide.

7. The method of claim 1 wherein the step of implanting ions of a conductivity determining impurity comprises the step of implanting ions of a group 15 element.

8. The method of claim 7 wherein the step of implanting ions of a conductivity determining impurity comprises the step of implanting arsenic ions.

9. A method for fabricating a semiconductor device in and on a silicon substrate comprising the steps of:
    forming an impurity doped region in the silicon substrate, the impurity doped region having a surface;
    forming a metal silicide region at the surface of the impurity doped region;
    forming an insulator layer overlying the silicon substrate;
    forming an opening in the insulator layer to expose a portion of the metal silicide region;
    depositing a titanium layer into the opening and contacting the metal silicide region;
    forming a titanium nitride barrier layer overlying the titanium layer, and thereby forming an interface between the titanium layer and the titanium nitride barrier layer, the titanium layer and the titanium nitride barrier layer cooperating to form a metallic liner;
    implanting ions of a conductivity determining group 15 element into the titanium nitride barrier layer, the ions being implanted under implantation conditions that produce a peak implant concentration within the metallic liner substantially at the interface between the titanium layer and the titanium nitride barrier layer; and
    depositing a material comprising tungsten in contact with the titanium nitride barrier layer to fill the opening.

10. The method of claim 9 wherein the metal silicide region comprises a metal silicide selected from the group consisting of nickel silicide, cobalt silicide, nickel/platinum silicide, platinum silicide, titanium silicide, and rhodium silicide.

11. The method of claim 9 wherein the step of implanting ions comprises the step of implanting ions of elements from the group consisting of phosphorus and arsenic.

12. The method of claim 9 wherein the step of depositing a material comprising tungsten comprises the step of chemical vapor depositing a layer of tungsten by a reaction of tungsten hexafluoride and hydrogen.

13. A method for fabricating a semiconductor device in and overlying a semiconductor substrate, the method comprising the steps of:
    forming an impurity doped region in the semiconductor substrate;
    forming an insulating layer overlying the semiconductor substrate and the impurity doped region;
    photolithographically patterning and etching the insulating layer to form an opening through the insulating layer to expose a portion of the impurity doped region, the opening bounded by walls of the insulator;
    depositing a first metal layer into the opening, along the walls, and electrically contacting the portion of the impurity doped region;
    forming an electrically conductive barrier layer overlying the first metal layer, the electrically conductive barrier layer having a thickness insufficient to fill the opening, and thereby forming an interface between the first metal layer and the electrically conductive barrier layer, the first metal layer and the electrically conductive barrier layer cooperating to form a metallic liner;
    ion implanting the electrically conductive barrier layer with ions of a conductivity determining impurity, the ions being implanted with an implant energy that produces a peak implant concentration within the metallic liner substantially at the interface between the first metal layer and the electrically conductive barrier layer; and depositing a tungsten plug material overlying the electrically conductive barrier layer to fill the opening.

14. The method of claim 13 further comprising the step of forming a metal silicide layer at a surface of the impurity doped region and wherein the first metal layer physically contacts the metal silicide layer.

15. The method of claim 13 wherein the step of depositing a first metal layer comprises the step of depositing a layer of titanium and the step of forming an electrically conductive barrier layer comprises the step of forming a layer of titanium nitride, the layer of titanium and the layer of titanium nitride forming the interface therebetween.

16. The method of claim 15 wherein the step of ion implanting comprises the step of ion implanting the titanium nitride layer with arsenic ions.

17. The method of claim 15 wherein the step of depositing a layer of titanium comprises the step of depositing a layer of titanium by physical vapor deposition, the step of forming a layer of titanium nitride comprises the step of depositing a layer of titanium nitride by a process of chemical vapor deposition, and the step of depositing a tungsten plug material comprises the step of depositing a layer of tungsten by chemical vapor deposition.

18. The method of claim 13 wherein the step of depositing a first metal layer comprises the step of depositing a layer of tantalum and the step of forming an electrically conductive barrier layer comprises the step of forming a layer of tantalum nitride.

* * * * *